United States Patent [19]

Saiki et al.

[11] 4,436,583
[45] Mar. 13, 1984

[54] SELECTIVE ETCHING METHOD OF POLYIMIDE TYPE RESIN FILM

[75] Inventors: Atsushi Saiki, Koganei; Takao Iwayanagi, Nerima; Saburo Nonogaki, Meguro; Takashi Nishida, Taitou; Seiki Harada, Hachioji, all of Japan

[73] Assignee: Hitachi, Ltd., Tokyo, Japan

[21] Appl. No.: 445,576

[22] Filed: Nov. 30, 1982

[30] Foreign Application Priority Data

Dec. 21, 1981 [JP] Japan .............................. 56-205326

[51] Int. Cl.³ ..................... B44C 1/22; C03C 15/00; C03C 25/06; B29C 17/08
[52] U.S. Cl. ............................... 156/659.1; 156/668; 156/904; 252/79.1; 430/313; 430/317
[58] Field of Search ................................. 430/313, 317; 156/659.1, 668, 904; 252/79.1, 79.4, 79.5

[56] References Cited

U.S. PATENT DOCUMENTS 3,833,436 9/1974 Hillis et al. ..................... 156/668 X Primary Examiner—William A. Powell
Attorney, Agent, or Firm—Antonelli, Terry & Wands

[57] ABSTRACT

Disclosed is a selective etching method of a polyimide type resin film which uses an etching mask consisting of a negative type photoresist material prepared by adding a photosensitive reagent to an unsaturated ketone polymer such as polymethylisopropenylketone as the base resin and an etching solution consisting of 20 to 40% by volume of hydrazine hydrate and the balance of a polyamine. The etching method of the present invention can provide the pattern of the polyimide type resin film having high dimensional accuracy by wet etching.

8 Claims, 2 Drawing Figures

SELECTIVE ETCHING METHOD OF POLYIMIDE TYPE RESIN FILM

BACKGROUND OF THE INVENTION

This invention relates to a selective etching method of a polyimide type resin film. More particularly, the present invention relates to an etching method of a polyimide type resin film used as an interlevel insulation film of multilevel metallization or a passivation film of transistors, ICs and LSIs.

The conventional etching method of the polyimide type resin film can be broadly classified into wet etching and dry etching. Wet etching can be further classified into a method to be practised under the state in which the polyimide type resin is baked at a temperature ranging from about 100° to about 150° C. and is semicured (B-stage) and another which is to be practised after the polyimide resin is cured. The etching method to be carried out under the semicured state of the polyimide resin makes use of a positive type photoresist consisting of a Novolac type resin soluble to an alkaline solution such as AZ1350 (tradename of Shipley Co., U.S.A.) or OFPR (tradename of Tokyo Oka K.K., Japan) and etches the polyimide type resin film simultaneously with developing the former resin using the developing solution. However, the developing solution is alkaline and is permeable to the positive type photoresist film so that etching can not be made with a high level of accuracy in forming a fine via hole as small as 10 μm square.

On the other hand, it is also possible to practise etching under the same semicured state by use of a negative photoresist such as OMR 83 (tradename of Tokyo Oka K.K.) of a cyclic rubber type in a mixed solution of hydrazine hydrate and a polyamine such as ethylenediamine. However, the etching speed of the polyimide film is extremely susceptible to the baking temperature during semicuring and a problem is yet left as to the stability of etching.

Among the conventional etching methods, the most stable etching method is to carry out etching by use of a mixed solution of hydrazine hydrate and a polyamide such as ethylenediamine under the state in which the polyimide film is fully cured at a temperature of about 350° C. A cyclic rubber-bisazide type negative photoresist such as OMR 83 is selected as the photoresist because it is only one resist durable to hydrazine hydrate, and a fine via hole as small as 3 μm square can be made.

The dry etching method uses O₂ plasma or O₂ sputtering. However, since this method requires an additional masking the film such as Mo or Cr or other inorganic films, it involves the drawback that the number of etching steps increases.

The following references are cited to show the state of the art:

---
(1) U.S. Pat. No. 3,846,166 to A. Saiki et al;
(2) U.S. Pat. No. 4,113,550 to A. Saiki et al;
(3) U.S. Pat. No. 4,218,283 to A. Saiki et al.
---

SUMMARY OF THE INVENTION

The present invention is directed to provide an improved selective etching method of a polyimide type resin film which method eliminates the problems with the conventional selective etching methods of the polyimide type resin film described above and which makes it possible to obtain the polyimide type resin film having a predetermined pattern of a high dimensional accuracy by wet etching.

To accomplish this object, the selective etching method of the polyimide type resin film in accordance with the present invention comprises forming a film made of a negative type photoresist material using an unsaturated ketone polymer as a base resin on a polyimide type resin film, exposing a predetermined portion or portions of the film, developing the same to obtain an etching mask having a predetermined pattern and etching the resin film by use of the mask and a mixed solution consisting essentially of 20 to 40% by volume of hydrazine hydrate and the balance of polyamine as the etching solution.

The unsaturated ketone polymer is expressed by the following general formula:

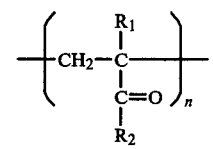

It is preferred that $R_1$ in the formula above is H or an alkyl group of up to 4 carbon atoms and $R_2$ is an alkyl or phenyl group of up to 4 carbon atoms. For example, the polymer is preferably at least one member selected from the group consisting of polymethyl isopropenylketone, polyethylisopropenylketone, polymethylvinylketone, polyvinylphenylketone and polyethylvinylketone.

The photoresist material in the etching method of the present invention is prepared by using the unsaturated ketone polymer as the base resin and adding a suitable photosensitive reagent to the base resin. Bisazide type photosensitive reagents are suitable as the photosensitive reagent. Definite examples include 2,6-di(4'-azidebenzal)-4-methylcyclohexanone, 4,4'-diazidephenylthioether, 4,4'-diazidestilbene, 4,4'-diazidechalkone, 4,4'-diazidebenzalacetone and 2,6-di(4-azidebenzal)cyclohexanone.

The concentration of the photosensitive reagent in the photoresist material is preferably from 5 to 25 wt%. If the amount exceeds this limit, the reagent is likely to precipitate.

A mixed solution of hydrazine hydrate and polyamine is used as the etching solution as described already. Preferred examples of polyamines include ethylenediamine, thrimethylenediamine, tetramethylenediamine, hexamethylenediamine, diethylenetriamine and triethylenetetramine. Among them, especially preferred is ethylenediamine.

The background until the present invention is completed will be stated briefly.

As fabrication technique of ICs and LSIs in higher integration density has made a remarkable progress in recent years, a via hole size has become below 3 μm square and extremely fine etching technique has become necessary. The etching method which is only one stable and reliable method at present uses OMR 83 as the resist film and hydrazine in combination with ethylenediamine as an etchant but according to the experiments carried out by the inventors of the present invention, it has been confirmed that it is difficult to etch an aperture of below 3 μm square with a high level of accuracy by this method.

In other words, it has been found that the OMR 83 resist film has a property which permits the slight permeation of hydrazine therethrough. Lines a, b and c in FIG. 1 represent the experimental results that evidence the permeability of hydrazine through OMR 83.

PIQ (tradename of Hitachi Kasei K.K.; polymer concentration=15wt%, viscosity=1,100 cps) was used as the polyimide type resin and was spin-coated on an Si substrate. Final curing was then made at 350° C. OMR 83 was formed on this PIQ film in a thickness ranging from 0.9 to 1.8 μm and was then dipped into 100% hydrazine hydrate. After OMR 83 was removed, the depth of the portion of the PIQ film penetrated by hydrazine hydrate was investigated. As a result, it was found that the arriving time of hydrazine at the PIQ film surface varied in accordance with the thickness of OMR 83 as shown in FIG. 1 but after the arrival at the film surface, hydrazine permeated into the PIQ film at the same permeation rate. It was thus clarified that hydrazine obviously permeated into the OMR 83 film. This made it impossible to make etching in an exact shape and difficult to make fine etching below 3 μm square. The lines a, b and c in FIG. 1 represent the thickness of 0.9 μm, 1.4 μm and 1.8 μm of the cyclic rubber type resist, respectively. The permeation depth of hydrazine is represented by reference numeral 3 in FIG. 2, which is a sectional view showing the permeation state of hydrazine into the PIQ film. Reference numerals 1, 2 and 4 represent the resist film, the PIQ film and Si, respectively.

In FIG. 1, the ordinate represents the penetrated depth by hydrazine and the abscissa does the etch rate in arbitrary scales, respectively.

Among the photoresists that are available at present, KTFR and KMER (tradename of Eastman Kodak Co., U.S.A.) are of the cyclic rubber type in the same way as OMR 83 and have the same property as to hydrazine permeability. Positive type AZ1350 and OFPR can not be used as the etching mask because they instantaneously dissolve in hydrazine. Polyvinyl phenol, polystyrene, PGMA (polyglycidyl methacrylate), PMMA (polymethyl methacrylate) and PMIPK (polymethyl isopropenylketone) that are used for electron beam resist and deep UV exposure can be used as the negative type resist by mixing them with a bisazide type photosensitive reagent. Hence, hydrazine durability of these compounds was also examined. As a result, polyvinyl phenol was found to easily dissolve in hydrazine. When dipped in hydrazine for 5 to 10 minutes, polystyrene and PGMA caused peel of the film from the PIQ surface. PMMA caused swelling within the dipping period of 10 to 20 minutes and peel was also occurred partially. Accordingly, it was found that polyvinyl phenol, polystyrene, PGMA and PMMA were not suitable for accomplishing the object of the invention.

As to PMIPK, however, peel of the film hardly occurred and the compound was found stable. When permeation by hydrazine was evaluated, hydrazine permeation was hardly observed, as represented by the line d in FIG. 1. In other words, the photoresist film using PMIPK as the base was formed on the PIQ film formed in the manner described already in order to evaluate the hydrazine permeability. A solution prepared by dissolving 10 wt% of PMIPK in cyclohexanone and adding 10 wt% of 2,6-di(4'-azidebenzal)-4-methylcyclohexanone as the photosensitive reagent to PMIPK was coated on the PIQ film and was then baked and exposed in an ordinary manner. The film was 0.8 μm thick.

Similarly, polyethylisopropenylketone, polymethylvinylketone, polyvinylphenyl ketone, polyethylvinylketone and their mixtures were found to have similar hydrazine durability. These compounds were found to be embraced in the material expressed by the following general formula:

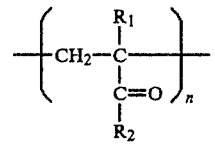

It is effective if $R_1$ in the formula above is H or an alkyl group of up to about 4 carbon atoms and $R_2$ is an alkyl or phenyl group of up to about 4 carbon atoms. In the formula, n is generally from 100 to 5,000 but 500 to 3,000 is especially preferred.

Using PMIPK as the base resin for the resist, 10 wt% of this PMIPK was dissolved in a cyclohexanone solution and 2,6-di(4'-azidebenzal)-4-methylcyclohexanone as the photosensitive reagent was added to the base resin at the ratio of 5 to 25 wt%, preparing a negative type resist. The resist was then coated on a 2 μm thick PIQ film and was prebacked at 85° C. for 20 minutes. The thickness was 0.8 μm. The PIQ film was etched after exposure and development. To form the PIQ film, 14.5 wt% of the prepolymer was coated and then backed at 200° C. for 60 minutes and at 350° C. for 30 minutes. Etching could be made with a high level of accuracy down to 3 μm square. When the 3 μm square was etched to substantially the same size as the pattern size, however, another disadvantage occurred that a pattern greater than 10 μm square was etched in a size greater than the necessary pattern. In this case, the composition of the etching solution was 7/3 of hydrazine hydrate to ethylenediamine in the volume ratio. The temperature of the etching solution was 30° C.

Accordingly, etching tests were continued by changing the composition of the etching solution. When etching was effected by use of the etching solutions having the volume ratio of hydrazine hydrate to ethylenediamine ranging from 4/6 to 2/8, the disadvantage that the etching time changed with the via hole size was substantially eliminated and etching of via holes having different size could be made within substantially the same etching time. Moreover, etching of fine via holes of 2 to 2.5 μm square could also be made. When PIQ film was etched using this etching solution composition and the OMR 83 resist, it was found that the OMR 83 film was peeled off from the PIQ surface before etching was completed and etching could not be made any longer. After all, it was found that the etching solution composition capable of etching PIQ using OMR 83 was limited to the range close to the ratio 7/3 described first where the dependency of the etching time upon the pattern size was great.

Incidentally, the unsaturated ketone polymers including PMIPK self-decompose to the ultraviolet rays and function as the positive type resist. However, since they have low sensitivity, about 60 to 120 seconds of time is necessary for exposure (at an intensity of 20 mW/cm$^2$) and they are not advantageous for industrial application.

Besides ethylenediamine, polyamines such as trimethylenediamine, tetramethylenediamine, hexamethylenediamine, diethylenetriamine, triethylenetetramine and the like provided satisfactory results, however ethylenediamine provided the most desirable result.

DESCRIPTION OF THE PREFERRED EMBODIMENTS

Example 1

Figure 1:
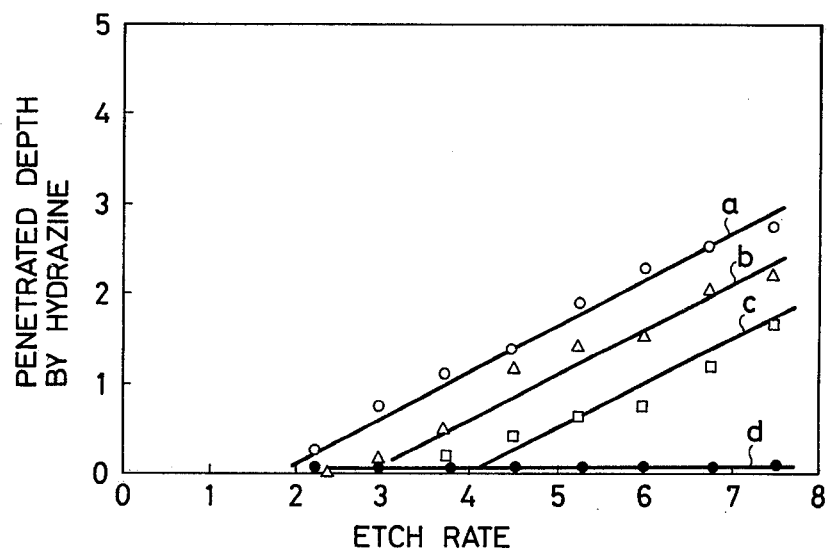
FIG. 1 is a diagram showing the durability of the resist film to hydrazine.
Figure 2:
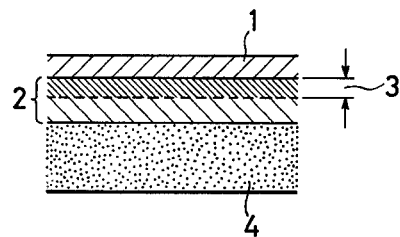
FIG. 2 is a sectional view showing the permeation state of hydrazine.

Polymethylisopropenylketone (PMIPK) was used as the unsaturated ketone polymer. In the general formula described already, this polymer had a methyl group —$CH_3$ at each of $R_1$ and $R_2$. 2,6-di(4'-azidebenzal)-4-methylcyclohexanone as the photosensitive reagent was added to the polymer to obtain a negative type photoresist. The resist solution prepared by dissolving the resist in cyclohexanone solvent was coated on a PIQ film and was pre-baked at 85° C. for 20 minutes. A photomask having an aperture pattern down to minimal 2 $\mu$m square was brought into intimate contact with the film and ordinary UV light was radiated. Next, development was made using cyclohexanone and rinsing was made using n-butyl acetate, followed by post-baking at 140° C. for 20 minutes. The PIQ film was formed by spin-coating a 14.5 wt% prepolymer solution at 3,500 rpm and baking it at 200° C. for 60 minutes and at 350° C. for 30 minutes. It was 2 $\mu$m thick. The PMIPK concentration was 10 wt% in the photoresist solution and the concentration of the photosensitive reagent was also 10 wt% in PMIPK. The photoresist film was 0.8 $\mu$m thick after development and exposure was made at 6-8 mW/$cm^2$ for 10 to 15 seconds. After development, the 2 $\mu$m thick PIQ film was etched by a 3:7 (volume ratio) mixed solution of hydrazine hydrate and ethylenediamine for 20 minutes. The temperature of the etching solution was controlled to 30° C. Adhesion between the resist and the PIQ film was good. Since the etching solution did not permeate into the portion covered with the resist, via holes of the pattern size of 2 to 2.5 $\mu$m square could be etched in the same etching time as via hole of 10 $\mu$m square.

It was also possible to use, as the developing solution, those solutions which could dissolve PMIPK or their mixed solutions.

The range of the composition of the etching solution, that made it possible to etch via hole ranging from 2 $\mu$m square to 10 $\mu$m square in substantially the same etching period in substantially the same pattern size, was from 4/6 to 2/8 in the volume ratio of hydrazine hydrate to ethylenediamine. If the hydrazine hydrate content became greater than 4/6, the etching time became greater for the smaller via holes and management of the etching time became difficult. If the hydrazine hydrate content was smaller than 2/8, the etching time of at least 30 minutes became necessary and this was industrially disadvantageous. When etching was made by use of OMR 83 with the etching solution falling within the range of 4/6 to 2/8, it was found that OMR 83 peeled off from the PIQ surface and etching was impossible.

Besides the photosensitive reagent described above, 4,4'-diazidestilben, 4,4'-diazidechalcone, 4,4'-diazidebenzalacetone, 2.6-(4-azidebenzal)cyclohexanone and the like were also used and good results could be likewise obtained because exposure could be made by ordinary UV light.

These photosensitive reagents were mixed with polyisopropenylketone, polymethylvinylketone, polyethylvinylketone and the like that were confirmed to have excellent durability to hydrazine in addition to PMIPK, and etching of PIQ was made by use of these unsaturated ketone polymers as the negative type photoresist. Good results could be obtained in the same way as PMIPK. The concentration of these photosensitive reagents was preferably from 5 to 25 wt% on the basis of the base resin. When the concentration was below this range, the sensitivity was insufficient and the photosensitive reagents were sometimes precipitated.

When Pyralin of Dupont was used as the polyimide resin, good results could also be obtained. PI-2545 (polymer concentration=14%, viscosity=1,100 cp) was used as Pyralin.

The pinhole density of the photoresist film was below 0.5 hole/$cm^2$ and this value caused no problem in practice. The effective curing temperature of PIQ was found to be from 200° to 400° C. The temperature of 200° C. was a point at which the percent imidization substantially reached saturation and when the temperature was below 200° C., the etching rate was too great to make precise control. If the temperature was above 400° C., the etching rate became too small and the etching time became longer and was industrially disadvantageous. The most preferred range was from 300° to 350° C.

Though the etching may be carried out at room temperature, heating to 30° to 40° C. may be employed in order to shorten the etching time. If the etching temperature is too high, however, the composition would change. Hence, the range described above is preferred.

Example 2

In the same way as in Example 1, polymethylisopropenylketone was used as the polymer, to which 4,4'-diazidephenylthioether was added as the photosensitive reagent. Deep UV light of 200 to 300 nm was radiated and development was made in the same way as in Example 1 to etch the PIQ film. Since the deep UV light was used, resolution was improved and the shape and etching accuracy of the through-holes ranging from 2 to 2.5 $\mu$m square were further improved.

Obviously many modifications and variations of the present invention are possible in the light of the above teachings. It is therefore to be understood that within the scope of the appended claims, the present invention may be practised otherwise than as specifically described.

What is claimed is:

1. A selective etching method of a polyimide type resin film, comprising forming a film made of negative type photoresist material using an unsaturated ketone polymer as a base resin on a polyimide type resin film, exposing a predetermined portion of said film, developing said film to obtain an etching mask having a predetermined pattern and etching said resin film by use of a mixed solution of 20 to 40 vol% of hydrazine hydrate and the balance of polyamine as the etching solution.

2. The selective etching method of a polyimide type resin film as defined in claim 1 wherein said unsaturated ketone polymer is expressed by the following general formula

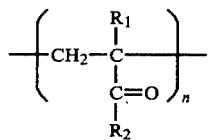

wherein $R_1$ is H or an alkyl group of up to 4 carbon atoms and $R_2$ is an alkyl or phenyl group of up to 4 carbon atoms.

3. The selective etching method of a polyimide type resin film as defined in claim 1 wherein said unsaturated ketone polymer is at least one member selected from the group consisting of polymethylisopropenylketone, polyethylisopropenylketone, polymethylvinylketone, polyvinylphenylketone and polyethylvinylketone.

4. The selective etching method of a polyimide type resin film as defined in any of claims 1 through 3 wherein said photoresist material is prepared by adding a bisazide type photosensitive reagent to said unsaturated ketone polymer.

5. The selective etching method of a polyimide type resin film as defined in any of claims 1 through 3 wherein said photoresist material is prepared by adding at least one member selected from the group consisting of 2,6-di(4'-azidebenzal)-4-methylcyclohexanone, 4,4'-diazidenphenylthioether, 4,4'-diazidestilben, 4,4'-diazidechalcon, 4,4'-diazidebenzalacetone and 2,6-di(4-azidebenzal)cyclohexanone as said photosensitive reagent to said unsaturated ketone polymer.

6. The selective etching method of a polyimide type resin film as defined in claim 4 wherein the concentration of said photosensitive reagent in said photoresist material is from 5 to 25 wt%.

7. The selective etching method of a polyimide type resin film as defined in any of claims 1 through 3 wherein said polyamide is ethylenediamine, trimethylenediamine, tetramethylenediamine, hexamethylenediamine, diethylenetriamine or triethylenetetramine.

8. The selective etching method of a polyimide type resin film as defined in claim 7 wherein said polyamine is ethylenediamine.

* * * * *